(12) United States Patent
Birdsley

(10) Patent No.: US 6,255,124 B1
(45) Date of Patent: Jul. 3, 2001

(54) TEST ARRANGEMENT AND METHOD FOR THINNED FLIP CHIP IC

(75) Inventor: Jeffrey D. Birdsley, Austin, TX (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/247,002

(22) Filed: Feb. 8, 1999

(51) Int. Cl.7 .................................................. H01L 21/66
(52) U.S. Cl. ................................................................ 438/14
(58) Field of Search ..................................................... 438/14

(56) References Cited

U.S. PATENT DOCUMENTS

| | | | | |
|---|---|---|---|---|
| 5,156,983 | * | 10/1992 | Schlesinger et al. | 437/8 |
| 5,298,464 | * | 3/1994 | Schlesinger et al. | 437/216 |
| 5,481,203 | * | 1/1996 | Appold | 324/755 |
| 5,686,833 | * | 11/1997 | Spinner | 324/158.1 |
| 5,888,882 | * | 3/1999 | Igel et al. | 438/460 |
| 5,904,486 | * | 5/1999 | Livengood et al. | 438/4 |
| 6,020,746 | * | 2/2000 | Livengood | 324/754 |
| 6,069,366 | * | 5/2000 | Goruganthu et al. | 250/559.27 |
| 6,072,190 | * | 6/2000 | Watanabe et al. | 257/48 |
| 6,078,057 | * | 6/2000 | Vallett | 257/48 |
| 6,107,792 | * | 8/2000 | Kim | 324/158.1 |

* cited by examiner

Primary Examiner—John F. Niebling
Assistant Examiner—Olivia Luk

(57) ABSTRACT

According to one aspect of the disclosure, the present invention provides methods and arrangements for testing a flip chip semiconductor device after the back side of the chip has been thinned to expose a selected region in the substrate. For some chips, thinning removes substrate material useful for drawing heat away from the internal circuitry when the circuitry is running at high speeds. To compensate for this material loss, a special test fixture having a heat-dissipating device is arranged to draw heat from the device.

20 Claims, 3 Drawing Sheets

TEST ARRANGEMENT AND METHOD FOR THINNED FLIP CHIP IC

RELATED PATENT DOCUMENTS

The present application is related to co-pending document identified by patent application Ser. No. 09/166,833, Birdsley et al., filed on Oct. 5, 1998, entitled "ENDPOINT DETECTION FOR THINNING OF A FLIP CHIP BONDED INTEGRATED CIRCUIT," which is assigned to the assignee of the present invention and is incorporated herein by reference.

FIELD OF THE INVENTION

The invention relates to semiconductor device assemblies, and more particularly to techniques for analyzing and debugging circuitry as may be applied, for example, to a flip-chip bonded integrated circuit.

BACKGROUND OF THE INVENTION

In recent years, the semiconductor industry has seen tremendous advances in technology which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

In the past, the die and package were first attached and then the electrical connections from the die to the package were made by wire bonding. The wire bonding procedure is simple in concept. A thin (0.7 to 1.0 mil) wire is first bonded to the chip bonding pad and spanned to the inner lead of the package lead frame. The third action was to bond the wire to the inner lead. Lastly, the wire is clipped and the entire process repeated at the next bonding pad. While simple in concept and procedure, wire bonding was critical because of the precise wire placement and electrical contact requirements. In addition to accurate placement, each and every wire must make a good electrical contact at both ends, span between the pad and the inner lead in a prescribed loop without kinks, and be at a safe distance from neighboring lead wires.

To increase the number of pad sites available for a die and to address other problems, a different chip packaging technique called controlled collapse chip connection or flip chip packaging is being adopted. In this technology, the bonding pads are provided with metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads and soldered. As a result, the dies are commonly called flip chips in the industry. Each bump connects to a corresponding package inner lead. The packages which result are lower profile and have lower electrical resistance and a shortened electrical path. The output terminals of the package may be ball-shaped conductive bump contacts (usually solder, or other similar conductive material) typically disposed in a rectangular array. These packages are occasionally referred to as "Ball Grid Array" (BGA). Alternatively, the output terminals of the package may be pins, and such a package is commonly known as pin grid array (PGA) package.

Once the die is attached to the package, the back side portion of the die remains exposed. The transistors and other circuitry are generally formed in a very thin epitaxially grown silicon layer on a single crystal silicon wafer of which the die is singulated from. The side of the die including the epitaxial layer containing the transistors, and the other active circuitry is often referred to as the circuit side of the die or front side of the die. The circuit side of the die is positioned very near the package. The circuit side opposes the back side of the die. Between the back side and the circuit side of the die is single crystalline silicon. The positioning of the circuit side provides many of the advantages of the flip chip. However, in some instances the orientation of the die with the circuit side face down on a substrate may be a disadvantage or present new challenges. When a circuit fails, when circuit testing is desired, or when it is necessary to modify a particular chip, access to the transistors and circuitry near the circuit side is obtained only from the back side of the chip. This is challenging since the transistors are in a very thin layer (about 10 micrometers) of silicon buried under the bulk silicon (greater than 500 micrometers). Thus, the circuit side of the flip chip die is not visible or accessible for viewing using optical or scanning electron microscopy.

Although the circuit of the integrated circuit (IC) is buried under the bulk silicon, infrared (IR) microscopy is capable of imaging the circuit because silicon is relatively transparent in these wavelengths of the radiation. However, because of the absorption losses of IR radiation in silicon, it is generally required to thin the die to less than 100 microns in order to view the circuit using IR microscopy. On a die that is 725 microns thick, this means removing at least 625 microns of silicon before IR microscopy can be used. Thinning the die for failure analysis of a flip chip bonded IC is usually accomplished in two or three steps. First, the die is thinned across the whole die surface. This is also referred to as global thinning. Global thinning is done to allow viewing of the active circuit from the back side of the die using IR microscopy. Mechanical polishing is one method for global thinning.

Once an area is identified as an area of interest and it is determined that access is needed to a particular area of the circuit, local thinning techniques can be used to thin an area smaller than the die size. Laser microchemical etching of silicon is one method of local thinning.

Sometimes it is necessary for failure analysis, or for design debug, after global and/or local thinning, to make electrical contact and probe certain nodes in the circuit. This testing can be performed via the thinned back side or via pads on the circuit side of the chip. When testing via pads on the circuit side of the chip, the chip is typically placed in a test fixture having a circuit connector arranged to connect to these circuit-side pads. The chip is activated through the test fixture, and signals at the nodes are analyzed. For certain applications, it has been discovered in connection with the present invention that the above-described thinning to remove substrate material results in the circuitry overheating. When there is insufficient substrate material for drawing heat away from the internal circuitry, for example, when the circuitry is running at high speeds, the internal circuitry overheats and becomes inoperative. Consequently, the analysis/debug efforts are destroyed.

Accordingly, there is a need for a testing approach that overcomes the above-mentioned shortcomings.

SUMMARY OF THE INVENTION

According to one aspect of the disclosure, the present invention provides an approach for testing a flip chip semiconductor device after the back side of the chip has been thinned to expose a selected region in the substrate. Thinning removes substrate material useful for drawing heat away from the internal circuitry when the circuitry is running at high speeds. To compensate for this material loss, a test fixture having a heat-dissipating device is arranged to draw heat from the back side of the device.

In one example embodiment, the present invention is directed to a method for testing a semiconductor device having a circuit side and a back side. The method includes: thinning the semiconductor device and exposing a selected region in the semiconductor device at its back side; securing the semiconductor device in a test fixture and arranging the semiconductor for testing via its circuit side; and activating the semiconductor device while using the heat-conductive element to dissipate heat generated by the semiconductor device.

In another example embodiment, the present invention is directed to an arrangement for testing a semiconductor device having a circuit side and a back side. The test arrangement comprises: a test fixture adapted to secure the semiconductor device; a heat sink coupled to the semiconductor device and adapted 10 to conduct heat generated by the semiconductor device. The test fixture is adapted to test the semiconductor device while the semiconductor device is activated and while the heat sink dissipates heat generated by the semiconductor device. In a more particular embodiment, the semiconductor device includes a circuit die and a package, with the heat sink coupled to the package and drawing heat from the device through the package.

The above summary is not intended to describe each illustrated embodiment or every implementation of the present invention. The figures and the detailed description which follow more particularly exemplify these embodiments.

BRIEF DESCRIPTION OF THE DRAWINGS

The following detailed description can best be understood when read in conjunction with the following drawings, in which.

Figure 1:
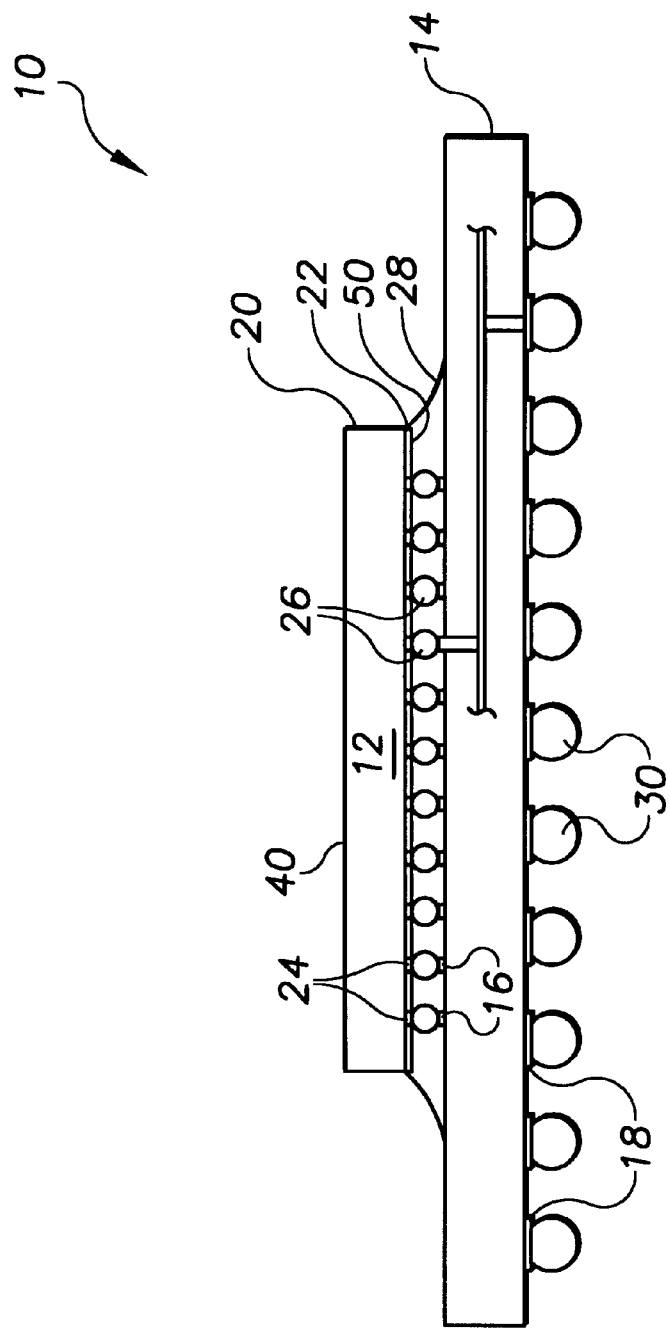
FIG. 1 shows a side view of a conventional flip chip packaged integrated circuit.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chip type circuit packages. While the present invention is not limited to flip-chip type circuit packages, an appreciation of various aspects of the invention is best gained through a discussion of various examples using this application.

According to a particular embodiment of the present invention, a conventional flip chip type die is tested by first thinning the back side of the die to expose a selected region over suspect circuitry. This suspect circuitry may be analyzed using microscopy techniques or even modified after local thinning. Regardless of how or whether the suspect circuitry is analyzed from the back side of the die, once thinned the die is placed in a test fixture and arranged for testing via its circuit side. The test fixture is adapted to permit coupling of a heat-sink element to the semiconductor device including a circuit die, for example, directly to the die or, alternatively, when a package is part of the semiconductor device, directly to the package. The semiconductor device is then activated while using the heat-conductive element to dissipate heat generated by the semiconductor device, for example, directly from the die or, as the case may be, indirectly through the package.

FIG. 1 shows a side view 10 of one type of conventional flip chip type die 12 assembled to a package substrate 14. Flip chip die 12 has a circuit side 50 and a back side 40. The circuit side 50 includes a number of circuit devices formed near the circuit side in a portion of the die known as the epitaxial layer 22. The epitaxial layer 22 has a thickness in the range of 1 to 15 microns. The portion of the die shown above the epitaxial layer is known as the bulk layer 20. A plurality of solder bumps 26 are made on the circuit side 50 at pads 24. The solder bumps 26 are the inputs and outputs to the circuitry associated with the die 12. The flip chip type die 12 is attached to package substrate 14, such as a package for a flip chip via the solder bumps on the die 12. The package substrate 14 includes pads 16 which are arranged to correspond to the pattern of solder bumps on the die 12. The region between integrated circuit 12 and package substrate 14 is filled with an under-fill material 28 to encapsulate the solder bump connections and provide additional mechanical benefits. The pads 16 are coupled via circuitry to pads 18 on the package substrate. Solder bumps 30 are formed on the pads 18. The solder bumps 30 are the inputs and outputs to the circuitry associated with the package substrate 14. In another arrangement (not illustrated), the inputs and outputs to the circuitry associated with the package substrate 14 are implemented as pins rather than solder bumps.

For a flip chip type die such as die 12 of FIG. 1, failure analysis of a flip chip bonded IC can be accomplished using a global and/or local thinning process, such as mechanical polishing and laser microchemical etching, as previously discussed.

Figure 2:
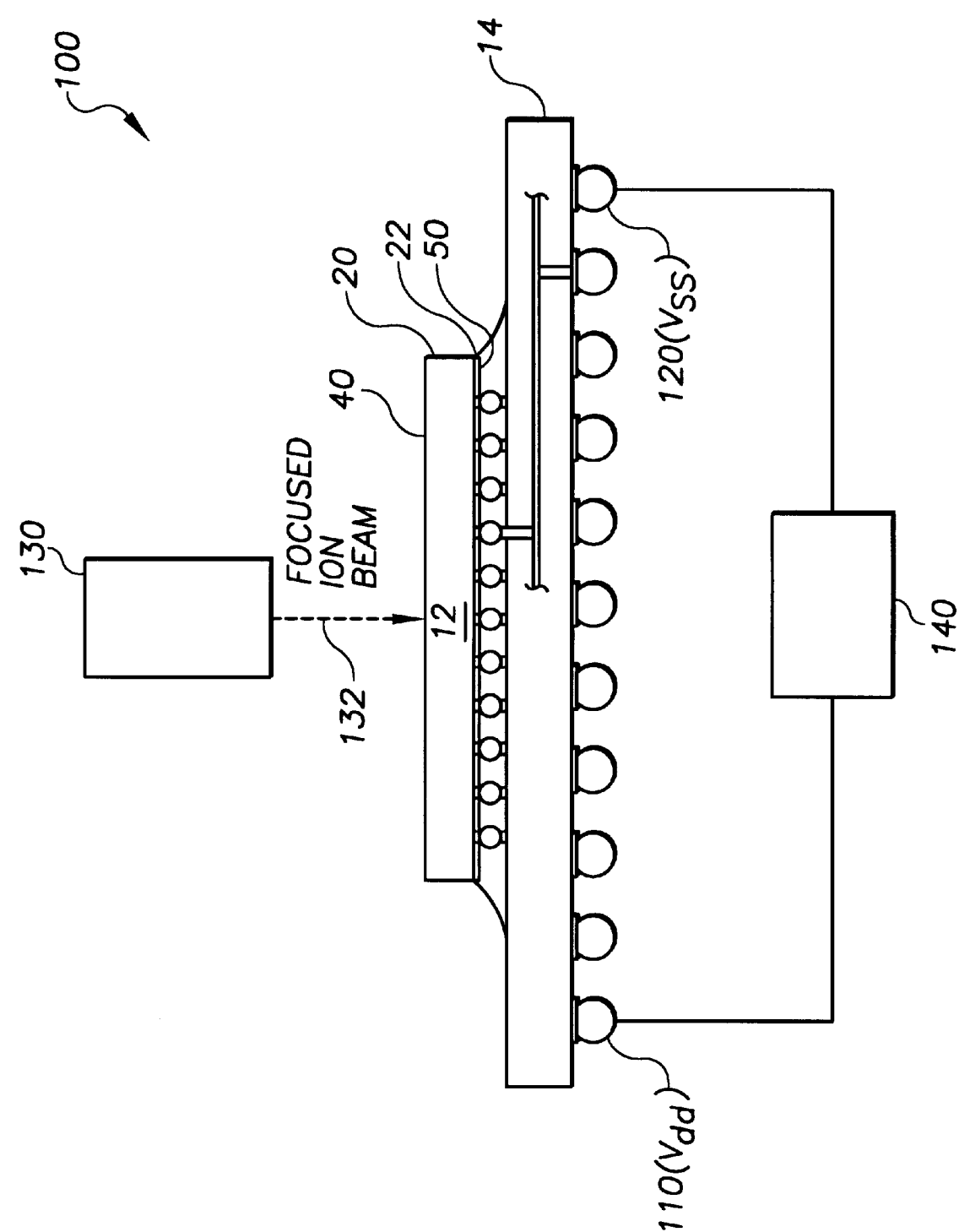
FIG. 2 shows a side view of an arrangement for milling and/or testing the integrated circuit of FIG. 1 via a back side of the die, according to one aspect of the present invention.

FIG. 2 shows a schematic view of an example thinning/test system 100 in which a substrate 20 of a flip chip type die 12, as attached to a package substrate or surface 14, is thinned. The system includes a focused ion beam apparatus 130 for removing portions of the die. The focused ion beam apparatus 130 produces a focused ion beam 132 that, in the presence of a gas that is reactive with the substrate, can be a used to locally thin the die. This is accomplished, for example, by removing a portion of silicon across the back side surface 40. The reactive gas may be, for example, xenon difluoride or chlorine. The focused ion beam 132 can also be used to locally thin a portion of the die 12. Localized thinning is done on an area of the back side 40 which is less than the entire area of the back side 40. In one embodiment, the focused ion beam 132 achieves global thinning and localized thinning of the die 12. In another embodiment, a polisher (chemically-based and/or mechanically-based) achieves global thinning of the die 12.

After thinning, an electrical signal measuring apparatus 140 can be coupled to pins 110 and 120 to measure a response to the current induced by focused ion beam 132. The apparatus 140 may be a conventional pico-ammeter, for example. The measured response to the induced current changes as the thickness of the bulk layer 20 of the die is reduced by milling in the location where the focused ion beam 132 is directed. This is performed to permit end point detection of the milling process, as described in connection with the above-referenced patent document.

After thinning, other electrical signal measurements can be made through the use of a test fixture, an example of which is manufactured and sold in accordance with a standard Schlumberger ATE (Automatic Test Equipment) Interface and specifications provided for the particular test fixture needed. Test fixtures of this type are adapted to permit a test connector to be connected directly to the test board, that connects to test pins of the package. As discussed above, however, the thinning results in the removal of substrate material that is otherwise used for drawing heat away from the internal circuitry when the circuitry is running at high speeds. Thus, when the device under test is activated via the test fixture, the thinning process may result in there being insufficient material that would otherwise be used for drawing heat away from the internal circuitry while operating at high speeds.

Figure 3:
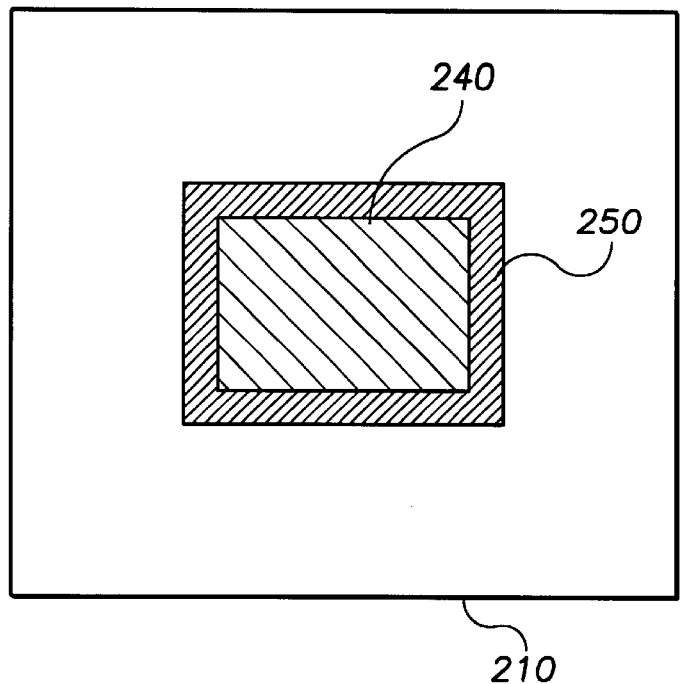
FIG. 3 shows a top view of a portion of a test fixture used to test an IC, according to the present invention.
Figure 4:
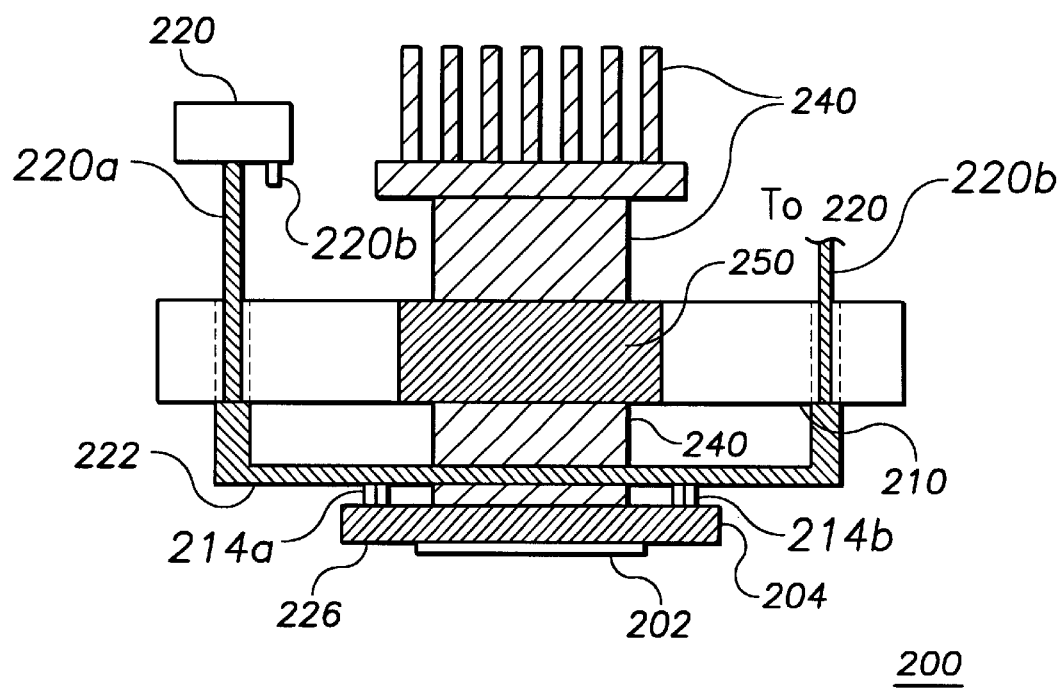
FIG. 4 shows a cross-sectional view of a flip chip die in a test fixture, according to certain example embodiments of the present invention.

FIGS. 3 and 4 illustrate an example test fixture 200 useful for testing the internal circuitry of the thinned die when the circuitry is running at speeds up to its highest speeds. As can be recognized from FIG. 4, the example test fixture 200 is set up to test a semiconductor device that includes both a die 202 and a package 204. The test fixture 200 includes an insulative vacuum seal plate 210 for vacuum-drawing and vacuum-maintaining the test fixture 200 against the test chamber.

This example test fixture 200 also includes a test connector 220 electrically connected to the die 202. Wires 220a and 220b emanating from the test connector 220 are fed through apertures in the seal plate 210 and connect to a test board 222. Using conductors on the test board 222, electrical communication from the wires 220a and 220b continues on, through sets of socket pins 214a and 214b, to provide power and signal access to the die 202. A conventional computer-based analyzer (not shown) is then used to analyze the internal circuitry of the thinned die while activated.

To compensate for the loss of heat-sink ability due to the thinning process, the test fixture 200 includes a heat-dissipating device (or "heat sink") 240 to draw heat from the back side of the device. In one particular embodiment, the heat-dissipating device 240 is an active device, such as is available from Pellitier, Inc. In another particular embodiment, the heat-dissipating device 240 is a passive device, made from a highly thermal-conductive metal, such as copper.

The heat-dissipating device 240 is constructed and arranged to fit in an aperture of the seal plate 210, with a vacuum seal 250 surrounding the heat-dissipating device 240 and providing an air-tight vacuum seal for a vacuum draw. The vacuum seal 250 may be manufactured from an expandable material, such as rubber or a pliable poly-based material. Because the heat may cause a slight outward expansion, the vacuum seal 250 has a thickness and a pliability factor adequate to tolerate the expansion without losing the air-tight seal.

The test fixture 200 of FIGS. 3 and 4 can be implemented by modifying one of the above-referenced types of test fixtures to include the aperture arrangement for a heat sink, as shown.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

What is claimed is:

1. A method for testing a semiconductor device having a circuit side and a back side, the method comprising:

securing the semiconductor device in a test fixture and arranging the semiconductor device for testing via its circuit side; and activating the semiconductor device while using a heat-conductive element to dissipate heat generated by the semiconductor device.

2. A method for testing a semiconductor device, according to claim 1, further including thinning the semiconductor device and exposing a selected region in the semiconductor device at its back side; wherein securing and arranging the semiconductor device further includes arranging the semiconductor device so that the heat is coupled to the heat-conductive element through a package portion of the semiconductor device.

3. A method for testing a semiconductor device, according to claim 2, wherein the circuit side is located in a first layer and includes pads, and wherein the test fixture includes a circuit connector that is coupled to the pads using socket pins.

4. A method for testing a semiconductor device, according to claim 2, wherein thinning the semiconductor device and exposing a selected region in the semiconductor device at its back side includes using a focused ion beam device.

5. A method for testing a semiconductor device, according to claim 2, wherein thinning the semiconductor device and exposing a selected region in the semiconductor device at its back side includes using an etching tool.

6. A method for testing a semiconductor device, according to claim 1, wherein securing the semiconductor device in a test fixture and arranging the semiconductor for testing via its circuit side includes vacuum sealing.

7. A method for testing a semiconductor device, according to claim 1, further including coupling a test connector to the semiconductor device through a test board.

8. A method for testing a semiconductor device, according to claim 7, wherein coupling a test connector to the semiconductor device through a test board further includes providing a test plate and coupling signals through conductors that pass through the test plate.

9. A method for testing a semiconductor device, according to claim 1, wherein securing and arranging the semiconductor device further includes arranging the semiconductor device so that a package side of the semiconductor device is accessible to a circuit connector and further including using the circuit connector to test nodes at circuits in the semiconductor device while the semiconductor device is activated and while using the heat-conductive element to dissipate heat generated by the semiconductor device.

10. A method for testing a semiconductor device, according to claim 1, wherein securing the semiconductor device in a test fixture and arranging the semiconductor for testing includes using a vacuum seal to assist in holding the test fixture against a test chamber.

11. A method for testing a semiconductor device, according to claim 10, wherein securing the semiconductor device in a test fixture and arranging the semiconductor for testing includes using a vacuum seal plate and wherein coupling a heat-conductive element to the exposed selected region includes placing the heat-conductive element through an aperture in the vacuum seal plate.

12. A method for testing a semiconductor device, according to claim 1, wherein securing the semiconductor device in a test fixture and arranging the semiconductor for testing via its circuit side includes using a support plate and wherein coupling a heat-conductive element to the exposed selected region includes placing the heat-conductive element through an aperture in the support plate.

13. A method for testing a semiconductor device, according to claim 1, wherein securing the semiconductor device in a test fixture and arranging the semiconductor for testing via its circuit side includes using a vacuum seal support plate and a test board, the vacuum seal support plate and the test board each including an aperture, and further including placing the heat-conductive element through each aperture.

14. A test arrangement for a semiconductor device having a circuit side and a back side and a package portion, comprising:

a test fixture adapted to secure and test the semiconductor device via the circuit side of the semiconductor device;

a heat sink adapted to conduct heat generated by the semiconductor device; and wherein the test fixture is adapted to test the semiconductor device while the semiconductor device is activated and while the heat sink dissipates heat generated by the semiconductor device.

15. A test arrangement for a semiconductor device, according to claim 14, wherein the heat sink is coupled to the package portion and further including an etcher adapted to thin the semiconductor device and to expose the selected region in the semiconductor device at its back side.

16. A test arrangement for a semiconductor device, according to claim 14, wherein the test fixture is further adapted to couple a circuit connector to the circuit side of the semiconductor device.

17. A test arrangement for a semiconductor device, according to claim 16, wherein the circuit connector is adapted to test nodes at circuits in the semiconductor device while the semiconductor device is activated and while using the heat-conductive element to dissipate heat generated by the semiconductor device.

18. A test arrangement for a semiconductor device having a circuit side and a back side, comprising:

means for securing and testing the semiconductor device via the circuit side of the semiconductor device;

means for conducting heat generated by the semiconductor device, and wherein the means for securing and testing is adapted to test the semiconductor device while the semiconductor device is activated and while the means for conducting heat dissipates heat generated by the semiconductor device.

19. A test arrangement for a semiconductor device, according to claim 18, further including means for thinning the semiconductor device and for exposing a selected region in the semiconductor device at its back side.

20. A test arrangement for a semiconductor device, according to claim 18, wherein the semiconductor device is a flip chip and further including an etcher adapted to thin the semiconductor device and to expose the selected region in the semiconductor device at its back side.

* * * * *

UNITED STATES PATENT AND TRADEMARK OFFICE
CERTIFICATE OF CORRECTION

PATENT NO.    : 6,255,124 B1
DATED         : July 3, 2001
INVENTOR(S)   : Birdsley It is certified that error appears in the above-identified patent and that said Letters Patent is hereby corrected as shown below:

<u>Column 4,</u>
Line 65, "a used to locally thin" should read -- used to locally thin --.

Signed and Sealed this

Eleventh Day of February, 2003

JAMES E. ROGAN
*Director of the United States Patent and Trademark Office*